(12) United States Patent
Sweeney (10) Patent No.: US 6,820,230 B2
(45) Date of Patent: Nov. 16, 2004

(54) SELF SYNCHRONOUS SCRAMBLER APPARATUS AND METHOD FOR USE IN DENSE WAVELENGTH DIVISION MULTIPLEXING

(75) Inventor: Brian Sweeney, Woodbridge, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 366 days.

(21) Appl. No.: 10/080,501

(22) Filed: Mar. 5, 2002

(65) Prior Publication Data

US 2003/0172336 A1 Sep. 11, 2003

(51) Int. Cl.[7] .............................................. H04J 14/00
(52) U.S. Cl. ...................................... 714/776; 370/480
(58) Field of Search ........................... 714/776; 370/480

(56) References Cited

U.S. PATENT DOCUMENTS

| 4,304,962 A | 12/1981 | Fracassi et al. |
| 4,744,104 A | 5/1988 | Pospischil |
| 4,807,290 A | 2/1989 | Pospischil |
| 5,086,470 A * | 2/1992 | Ballance ..................... 380/267 |
| 5,241,602 A | 8/1993 | Lee et al. |
| 5,245,661 A | 9/1993 | Lee et al. |
| 5,355,415 A | 10/1994 | Lee et al. |
| 5,530,959 A | 6/1996 | Amrany |
| 5,561,714 A | 10/1996 | Hershberger |
| 5,835,602 A | 11/1998 | Lang |
| 6,025,944 A * | 2/2000 | Mendez et al. ............... 398/78 |
| 6,151,336 A * | 11/2000 | Cheng et al. ............... 370/535 |
| 6,249,582 B1 | 6/2001 | Gilley |
| 6,577,732 B1 * | 6/2003 | Kartalopoulos .............. 380/33 |
| 6,738,935 B1 * | 5/2004 | Kimmitt ..................... 714/701 |

* cited by examiner

Primary Examiner—Stephen M. Baker
(74) Attorney, Agent, or Firm—John J. Karasek; John Gladstone Mills, III (57) ABSTRACT

A method employing a self-synchronous scrambler for transforming an arbitrary bit-stream into a bit-stream suitable for input to a DWDM network, and for reconstituting the original bit-stream from the transformed bit-stream. This method enables DWDM network equipment to properly transport data independent of the bit-stream characteristics and line encoding of the data. The self-synchronous scrambler of the present invention equalizes the number of "1"s and '0"s in an input bit-pattern over time periods of a few bit-clock periods, thus making it suitable for transport over a DWDM channel and providing for the recovery of the original bit-pattern from the scrambled pattern.

21 Claims, 7 Drawing Sheets

SELF SYNCHRONOUS SCRAMBLER APPARATUS AND METHOD FOR USE IN DENSE WAVELENGTH DIVISION MULTIPLEXING

BACKGROUND OF THE INVENTION

1. Field of the Invention

This invention relates to data communications, and more particularly, to methods and apparatuses for enabling dense wavelength division multiplexing (DWDM) network equipment to transport data independent of bit-stream characteristics and line coding of the data.

2. Description of Related Art

Optical networking is fast becoming the solution to provisioning future telecommunication systems with the required bandwidth for a wide variety of applications such as Internet services, video-on-demand and video conferencing. This commercial demand for higher aggregate data rates has led to rapid deployment of new communications technology and DWDM has emerged as a next step in this evolutionary process of high-speed networking.

DWDM network deployment has been made practical by several new technologies including optical signal multiplexers, optical signal demultiplexers, and optical amplifiers. As implemented on a DWDM network terminal, optical signal multiplexers accept multiple optical signals transmitted on different wavelengths (i.e., channels) of light over separate fibers and combine those signals onto a single fiber. DWDM network optical signal demultiplexers accept multiple optical signals carried on different wavelengths of light over a single fiber and separate the multiple signals onto separate fibers. Optical amplifiers boost the power levels of the multiplexed channels simultaneously, extending the transmission range of DWDM terminals to a practical and useful distance.

Figure 1:
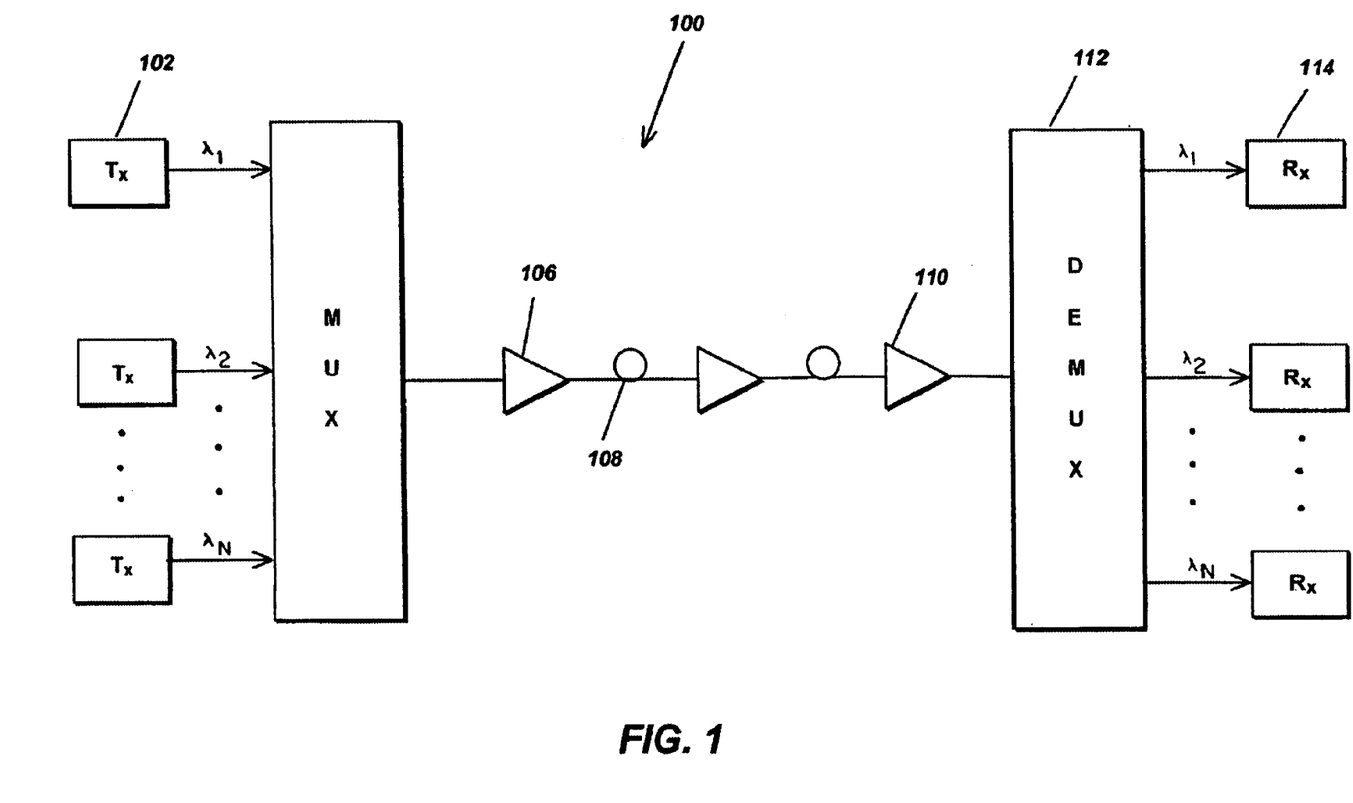
FIG. 1 illustrates a schematic implementation of a typical DWDM network having various active and passive components.

Wavelength division multiplexing (WDM) and DWDM enable an orthogonal set of carriers to be separated, routed, and switched without interfering with each other. Implementation of WDM and DWDM networks may require a variety of passive and/or active devices to combine, distribute, isolate, and amplify optical power at different wavelengths. FIG. 1 shows the use of such components in a typical WDM link. At the transmitting end, there are several independently modulated light sources 102, each emitting signals at a unique wavelength. A multiplexer 104 combines these optical outputs into a serial spectrum of closely spaced wavelength signals and couples them onto a single fiber 108. At the receiving end, a demultiplexer 112 separates the optical signals into appropriate detection channels for signal processing.

DWDM terminals interface with most high-speed communications terminals via Optical Line Input-Output units (OLIU). The optical input unit of a DWDM terminal accepts an incoming single channel optical data stream, converts the incoming optical data stream to an electrical binary data stream, retransmits the binary data stream as an optical signal at a specific wavelength suitable for optical multiplexing, and presents the optical signal to the multiplexer. The optical output unit of the DWDM terminal performs a reverse operation as that of the optical input unit the DWDM terminal. That is, the optical output unit accepts an individual wavelength from the multiplexed optical stream, converts the multiplexed signal to an electrical binary data stream, and converts the electrical stream to an optical signal suitable for reception by a single channel network terminal.

Optical amplifiers play an important role in the deployment and proper operation of DWDM networks. In general, the gain applied to an individual optical channel is proportional to its signal strength. Optical amplifiers used for DWDM network applications employ channel monitoring and active gain flattening hardware to equalize channel signal strengths. The reaction time, however, of this hardware is lengthy compared to the time it takes to transmit individual bits of information over the DWDM channel.

In one approach, line coding schemes are designed to provide a DC-balanced signal level such as Code Mark Inversion (CMI), and 8-bit/10-bit Partitioned Block Transmission Code to provide channel equalization on a DWDM network for arbitrary bit patterns. These codes, however, were devised for single-channel (non-DWDM) transmission systems to accomplish clock-recovery at a receiver unit of the encoded bit-stream, and to produce a balanced signal on the transmission line for proper operation with electrical components such as, for example, capacitors and electronic amplifiers.

The Partitioned Block transmission code approach requires a greater amount of overhead for transmitting arbitrary bit streams. It further includes error multiplication characteristics that are difficult to overcome using bit-error detection and correction code approaches.

Another approach involving a CMI code is disfavored in view of modern transmission protocols as it requires a 100 percent overhead. In this approach, two bits are output from the CMI encoder for every input bit. For example, a binary "0" is encoded as a binary sequence "01", and a binary "1" is encoded alternately as a binary sequence "00" or "11". Further, the binary sequence "10" is not allowed as it is used by the CMI framer to locate frame synchronization. Thus, a single bit error on the encoded bit-stream will cause either a single bit-error, or a disallowed state on the decoder. This latter event could cause a burst error as the receiver recovers its state.

Yet another approach involves a 8-bit/10-bit partitioned block transmission code that accepts 8-bit "bytes" of input data and encodes it as a 10-bit "symbol" for output. With respect to optical networks, the 10-bit symbol is encoded on the line using non-return-to-zero (NRZ) two-level optical pulses. Symbols are chosen so as to "even-out" the occurrence of "1"s and "0"s. There are no more than seven and no less than three "1"s in any 10-bit symbol. Additionally, there are two possible binary-complementary 10-bit symbols that are used to represent every 8-bit input byte. A flag bit is used to maintain count of the number of "1"s and "0"s that have been transmitted, and also to select which of the two possible symbols are used to represent an 8-bit byte. As 10-bits are required to encode each 8-bit input value, this coding scheme has about a 25% overhead. Bit errors which occur within the 10-bit symbol can produce an 8-bit burst error on decoding. Although error detection and correction schemes may be devised to correct errors induced by the 8-bit/10-bit coding scheme, such schemes are not employed in 8-bit/10-bit transmission hardware in view of the level of complexity and overhead involved therein.

Currently available DWDM equipment is subject to failure caused by power levels of the multiplexed channels being out of equalization. This condition may arises when the number of "1"s and "0"s present in a line encoded bit-pattern are disproportionate over time intervals on the order of a millisecond. Data transmission protocols currently in use do not preclude this condition. There is, however, no approach that is currently available for encoding and decoding arbitrary bit-streams onto a DWDM network. The present invention proposes a solution to overcome the problems of prior approaches.

SUMMARY OF THE INVENTION

A method and apparatus for use in DWDM network equipment for transporting data independent of bit-stream characteristics and line coding is proposed. In a preferred exemplary embodiment, a self-synchronous scrambler is used for transforming an arbitrary bit-stream into a bit-stream suitable for input to a DWDM network, and for reconstituting the original bit-stream from the transformed bit-stream. The self-synchronous scrambler equalizes the number of "1"s and "0"s in an input bit-pattern over time periods of a few bit-clock periods, thus making it suitable for transport over a DWDM channel and providing for the recovery of the original bit-pattern from the scrambled pattern.

The optical input unit of the self-synchronous scrambler applies error correcting codes to correct for error multiplication in the process of equalizing the number of "1"s and "0"s in the input bit-pattern. In one embodiment, the size of the frame to transport input bits is fixed. In another embodiment, the size of the frame is variable (i.e., the number of data bits of the frame may be greater than the number of stages in the scrambler).

While the invention has been herein shown and described in what is presently conceived to be the most practical and preferred embodiment, it will be apparent to those of ordinary skill in the art that many modifications may be made thereof within the scope of the invention, which scope is to be accorded the broadest interpretation of the appended claims so as to encompass all equivalent methods and apparatus.

In one exemplary non-limiting aspect, the present invention provides a method for transforming and communicating an arbitrary bit-stream data into a bit-stream suitable for input to a dense wavelength division multiplexing (DWDM) network. The method includes receiving an optically encoded digital data stream; converting the encoded digital data stream to a binary data stream. The error correction is applied to the binary data stream to generate an error correcting code over a fixed number of input bits to correct for error multiplication, and the error correcting code is placed into the binary data stream to produce a bit-serial data stream. Logic present in a self-synchronous scrambler is applied on the bit-serial data stream, the scrambler having an executable logic to equalize "1"s and "0"s, in the arbitrary bit-stream data, over a plurality of bit-clock periods to produce scrambled bit-stream data. The scrambled bit-stream data is encoded and transmitted independent of its bit-stream characteristics and line coding.

The method also includes receiving and demultiplexing the encoded scrambled bit stream data; converting the encoded scrambled bit stream data into a binary data stream; descrambling the binary data stream using a self-synchronous descrambler having an executable logic, that is opposite to logic executed by the self-synchronous scrambler, to produce a bit-serial data stream. The frame synchronization is identified by applying the error correcting code on the bit-serial data stream. Data bits are separated from error correcting code bits, and the error correcting code is applied to correct single bit errors. The binary bit stream is encoded and descrambled in a format compatible with the encoded input data stream.

In another exemplary and non-limiting aspect, the present invention provides a digital data communications system for transmitting an arbitrary input bit-stream data from a source station to a destination station via an optical communications medium communicatively coupling the source and destination stations. The digital data communications system includes a DWDM input unit receiving the arbitrary data stream from the source station. The DWDM input unit includes an optical-to-electrical conversion unit for converting the arbitrary input bit-stream data into binary data stream, a self-synchronous scrambler executing a logic to equalize the number of "1"s and "0"s, in the binary data stream, over a plurality of bit-clock periods to produce a scrambled data stream; and an electric-to-optical conversion unit for encoding and transmitting the scrambled data stream via the optical communication medium, wherein the scrambler enables the DWDM input unit to transport the arbitrary input bit-stream data independent of its bit-stream characteristics and line coding. The data communications system also includes a DWDM output unit for receiving the scrambled data stream transmitted via the optical communications medium. The DWDM output unit includes a self-synchronous descrambler executing a logic that is opposite to the logic executed by the self-synchronous scrambler.

DETAILED DESCRIPTION OF EXEMPLARY EMBODIMENTS

Figure 2:
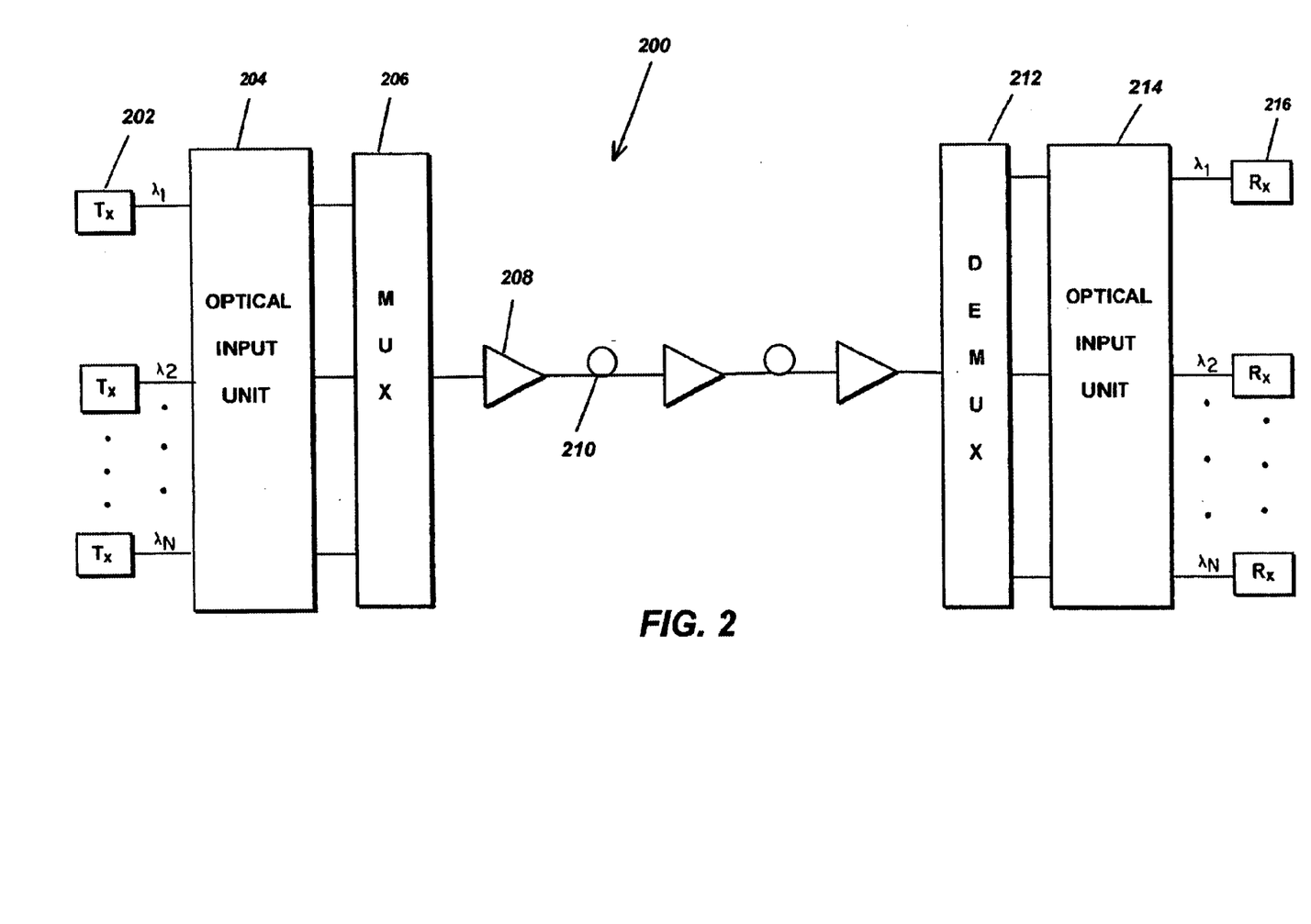
FIG. 2 is a illustrates a schematic implementation of a DWDM network in accordance with an exemplary embodiment of the present invention.

Referring to FIG. 2, there is shown a schematic implementation 200 of a DWDM network in accordance with an exemplary embodiment of the present invention. At the transmitting end, there are several independently modulated light sources 202, each emitting signals at a unique wavelength. The DWDM terminal unit or optical input unit 204 accepts either an optically encoded digital data stream on an optical fiber or an electrically encoded data stream on copper cable and coverts that encoded stream into a binary data stream. Encoded and scrambled signals are combined by a multiplexer 206 into a serial spectrum of closely spaced wavelength signals and couples them onto a single fiber 210. At the receiving end, a demultiplexer 212 separates the optical signals into appropriate detection channels for signal processing. The separated signals are received by the optical output unit 214 which performs a reverse operation compared to optical input unit 204. The received signals are descrambled by the output unit 214 and presented directly to a receiving device 216.

Figure 3:
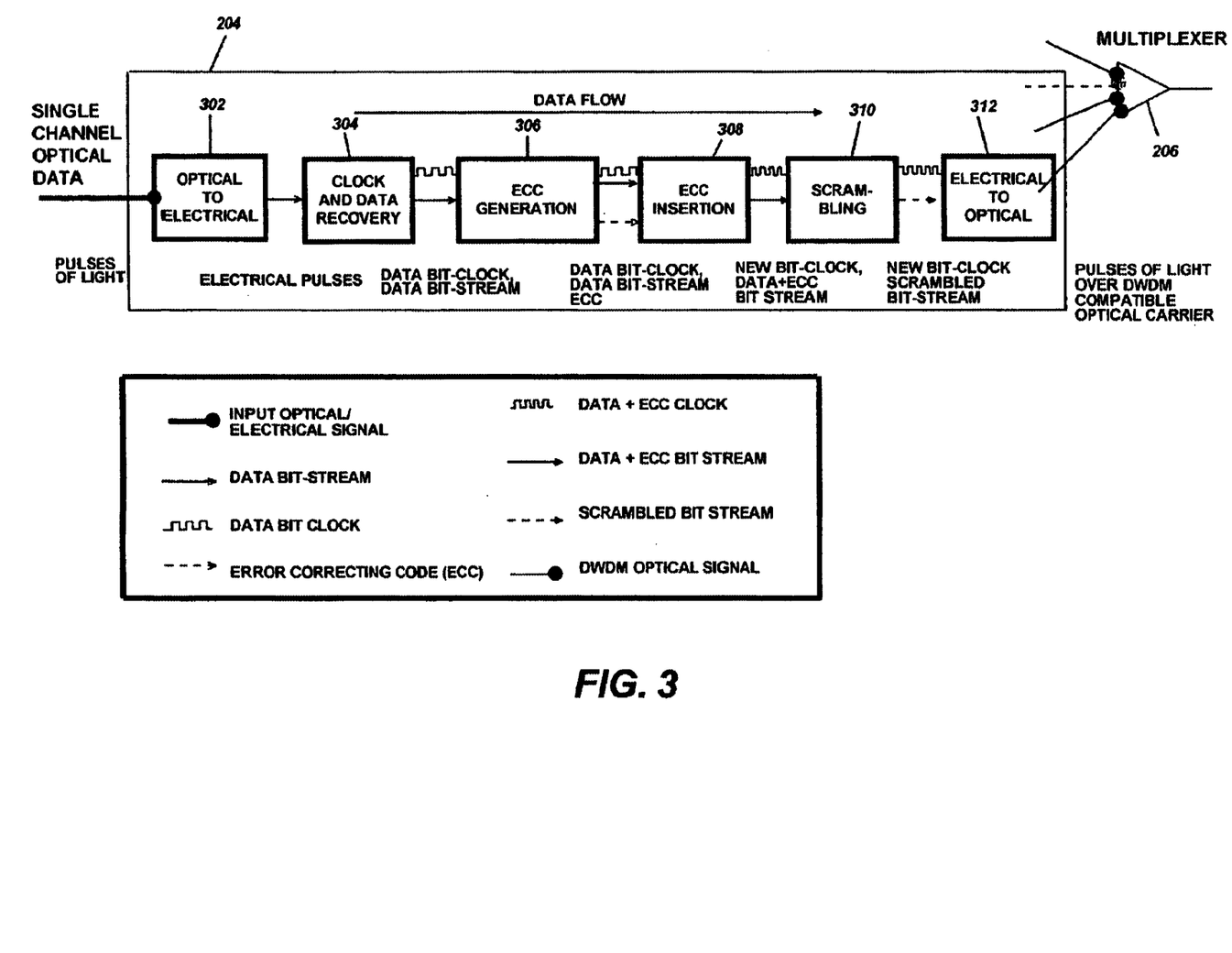
FIG. 3 illustrates details of the optical input unit shown in FIG. 2.

FIG. 3 shows details of the optical input unit 204 set forth in FIG. 2. The optical input unit 204 also referred to as DWDM terminal input unit accepts either an optically encoded digital data stream on an optical firer or an electrically encoded data stream on copper cable and converts the encoded stream to a binary data stream. This bit-serial binary stream is input to a self-synchronous scrambler 310, and the logic executed in the scrambler 310 is of the general form as shown by equation (1).

$$Y_k = x_k \oplus (\Sigma p=1 \text{ to } m(y_{(k-p)} \oplus S_p)) \quad (1)$$

where

⊕ denotes Exclusive OR function;

$x_k = k^{th}$ bit input to the scrambler;

$y_k = k^{th}$ bit output from the scrambler;

m = number of stages of the scrambler; and $S_p = 1$ if Stage p is active and 0 if p is not active.

Figure 5:
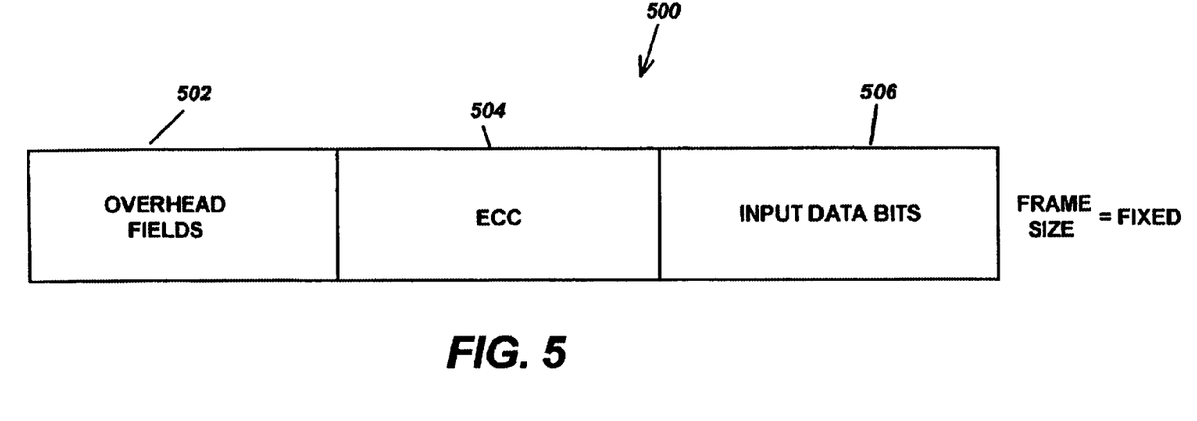
FIG. 5 illustrates an exemplary fixed size frame to transport input bits, optional overhead fields, and error correcting code in the implementation shown in FIG. 2.
Figure 8:
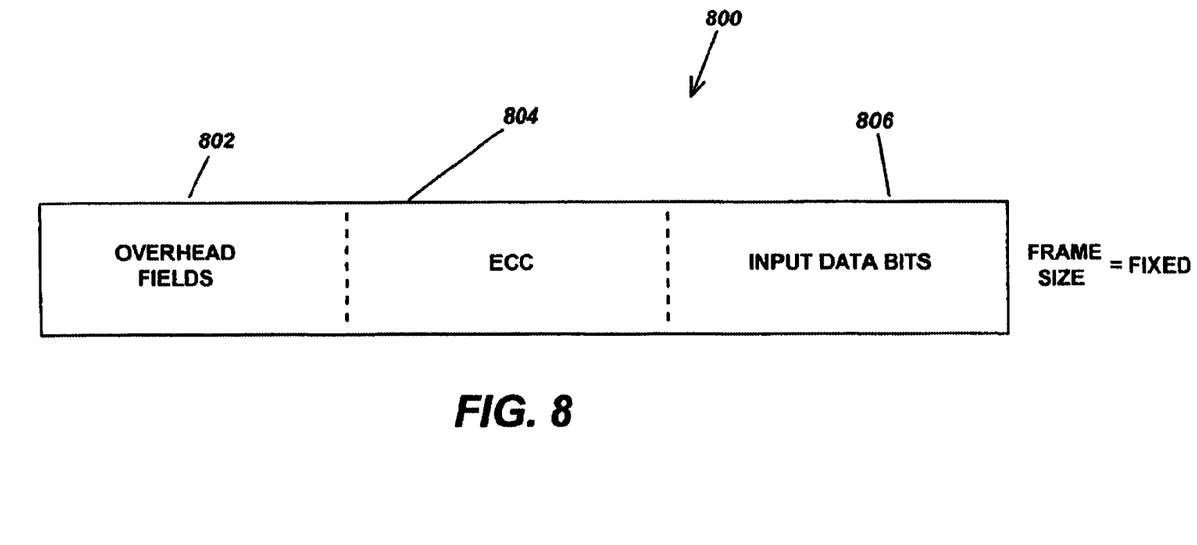
FIG. 8 illustrates an exemplary frame of variable size to transport input bits, optional overhead fields, and error correcting code in the implementation shown in FIG. 2.

A bit stream "x" is input to the scrambler 310 which produces a scrambled output bit stream "y". The optical input unit 204 optionally places the scrambled bit-stream into a fixed or variable length frame with framing bytes and error correction code, the details of exemplary frames are shown in FIGS. 5 and 8. The function of the optional frame format is to apply a level of error correcting code capable of correcting error multiplication that may occur when descrambling the bit-stream. The optical input unit 204 then encodes and transmits the self-scrambled bit stream using optical encoding, such as, for example, NRZ or RZ encoding, on a carrier suitable for optical multiplexing.

Figure 4:
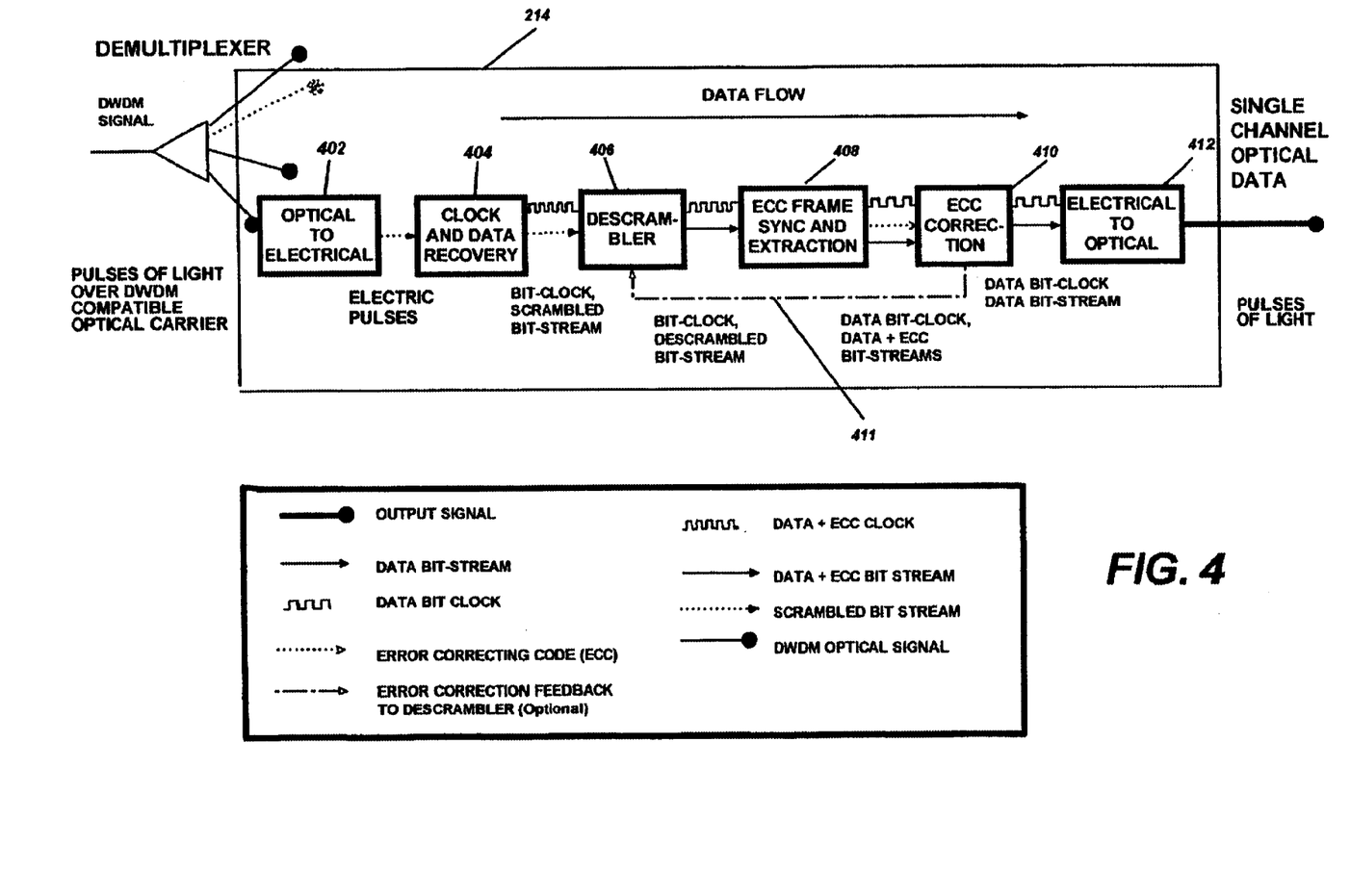
FIG. 4 illustrates details of the optical output unit shown in FIG. 2.

The original bit-stream x is recovered from the scrambled bit-stream y by reversing the process, executed in the scrambler, with a descrambler 406 (FIG. 4). The logic executed in the descrambler 406 is of the general form as shown by equation (2).

$$x_k = y_k \oplus (\Sigma p=1 \text{ to } m(y_{(k-p)} \oplus S_p)) \quad (2)$$

where

⊕ denotes Exclusive OR function;

$y_k = k^{th}$ bit input to the descrambler;

$x_k = k^{th}$ bit output from the descrambler;

m = number of stages of the descrambler; and $S_p = 1$ if Stage p is active and 0 if p is not active.

Values for "m" and "S" should preferably match that of a corresponding scrambler.

The descrambler is located at a receiving network terminal. Error multiplication likely occurs using the scrambler 310. A single error on a line will likely produce an error after descrambling for every active stage of the descrambler. If $y_k$ is in error, the descrambled data stream $X_{k+p}$ will be in error for every value of p in which $S_p$ is set to 1. The recovery requires m bits to flush the buffer of the descrambler 406 (FIG. 4). In order to minimize error multiplication, the only active stage of the scrambler/descrambler should be stage m. $S_m$ should preferably be set to 1, and stages $S_1$ through $S_{m-1}$ should be set to 0. If bit $y_k$ is in error, then bits $x_k$ and $x_{k+m}$ will be in error on output of the descrambler.

In an exemplary embodiment, the logic executed in the self-synchronous scrambler 310 which is optimized to reduce error multiplication is of the form as shown by equation (3).

$$y(k) = x(k) \oplus y(k-m) \quad (3)$$

where x(k) is the input to the scrambler;

y(k−m) is buffered output from m bits prior; and y(k) is the line output.

The matched self-synchronous descrambler executes logic to recover the original bit-stream, the logic having a form as shown by equation (4).

$$x(k) = y(k) \oplus y(k-m) \quad (4)$$

The optical input unit 204 (FIG. 2) may optionally apply error correcting code to correct for error multiplication. FIG. 3, as discussed above, shows details of the optical input unit using a scheme for framing data bits with error correcting code bits. In the embodiment shown in FIG. 3, the size of the frame 500, as illustrated in FIG. 5, is fixed to transport input bits, optional overhead fields, and error correcting code. The size of the frame 500 is fixed and is preferably less than the number of stages in the self-synchronous scrambler 310 (FIG. 3).

In operation, the optical input unit 204 accepts either an optically encoded digital data stream on an optical fiber 210 (FIG. 2) or an electrically encoded digital data stream on copper cable. The optically encoded data stream is converted to binary data stream by the optical-to-electrical unit 302. Fixed length overhead fields are added to the binary data stream by the clock and data recovery unit 304. An error correcting code is generated over the fixed size frame by the ECC generation unit 306 to correct for error multiplication resulting from the use of the self-synchronous scrambler 310.

The generated error correcting code is placed into the frame by the ECC insertion unit 308. Bit-serial data stream from the ECC insertion unit 308 is then applied to the self-synchronous scrambler 310 having logic as shown in equations (1) or (3). The scrambler 310 encodes and transmits the self-scrambled bit-stream using optical encoding, performed by electrical-to-optical unit 312, on a carrier suitable for optical multiplexing by multiplexer 206. The multiplexed data is then transmitted via the optical fiber 210.

FIG. 4 shows details of the optical output unit 214 set forth in FIG. 2. The multiplexed data transmitted via the optical fiber 210 is received by demultiplexer 212 and the demultiplexed encoded bit-stream is fed to the optical output unit 214. The encoded optical bit-stream is converted to a binary data stream by the optical-to-electrical converter 402. After further processing by the clock and data recovery unit 404 for fixed length data overhead fields, the bit-stream is descrambled by the self-synchronous descrambler 406.

Frame synchronization of the descrambled bit-stream is extracted by unit 408 by applying the error correcting code function on the serial data stream and separating data bits (original input binary stream plus optional fixed-length overhead fields) from error correcting code bits. Overhead fields, if used, are extracted by unit 408 and ECC correction is applied by unit 410 to correct potential single bit errors. An optional loop 411 may be provided to feedback corrected data bits to the descrambler 406. The recovered binary bit stream is decoded by the electrical-to-optical unit 412 in a format compatible with the encoded input signal received by unit 402. The decoded optical signals are received by respective receiver terminals 216 (FIG. 2).

Appendix 1 as enclosed herewith shows an exemplary pathological input signal having 16,384 consecutive ones followed by 16,384 consecutive zeroes. This example demonstrates the effects of the self-synchronous sampler as implemented in FIGS. 3 and 4 on a worst-case input. The scrambler length "m" (i.e., the number of stages) is set to 43 with only stage 43 fed back. A cyclic-redundancy-check 8 (CRC8) error correcting code is applied and appended to every 32 bits of input data producing a fixed-length 40 bit frame.

Figure 6:
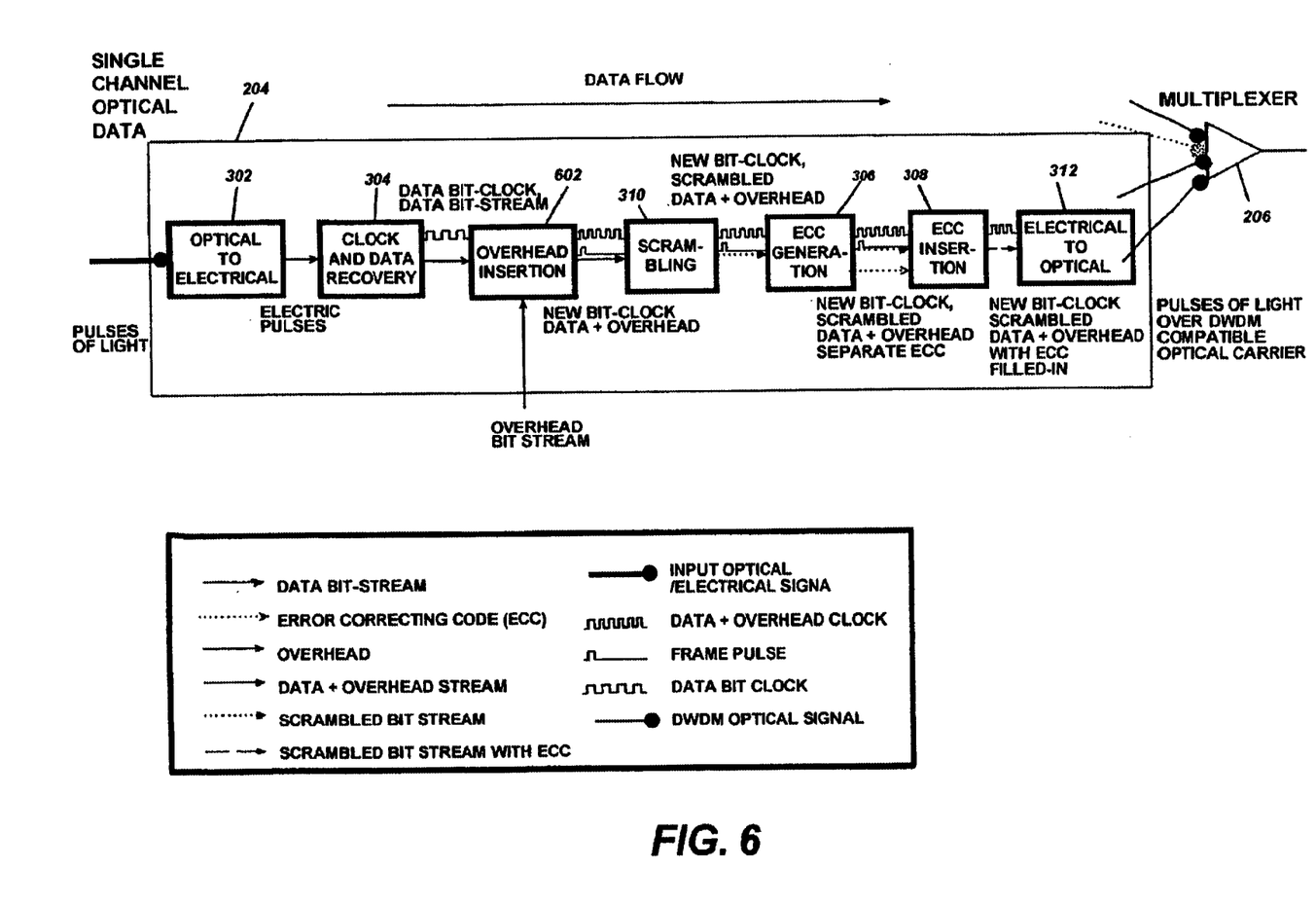
FIG. 6 is another embodiment of the present invention illustrating details of the optical input unit shown in FIG. 2.

FIG. 6 shows another embodiment of the present invention illustrating details of the optical input unit 204 shown in FIG. 2. Particularly, the framing technique of this embodiment allows the use of either a variable or a fixed size frame 800 (FIG. 8) to transport input bits and error correcting code. The number of data bits of the frame 800 may be greater than the number of stages in the scrambler 310. The error correcting code should preferably be sufficient to determine the position and correct a single bit error that occurs on the scrambled bit-stream. Fixed-length overhead fields are added to the binary data stream by the overhead insertion unit 602. Self-synchronous scrambler having logic identified by equations (1) or (3) is applied on the bit-serial (original input binary stream plus any optional overhead fields) data stream.

Error correcting code that is strong enough to correct single bit-errors is generated. The scrambled bit-stream and error correcting code is placed into a fixed or variable length frame with frame synchronization header bytes required for variable length frames and optional for fixed length frames. The resulting bit stream is encoded and transmitted using optical encoding on a carrier suitable for optical multiplexing by the multiplexer 206. The multiplexed bit-stream data is transported via the optical fiber 210 to be received by the demultiplexer 212 (FIG. 2).

Figure 7:
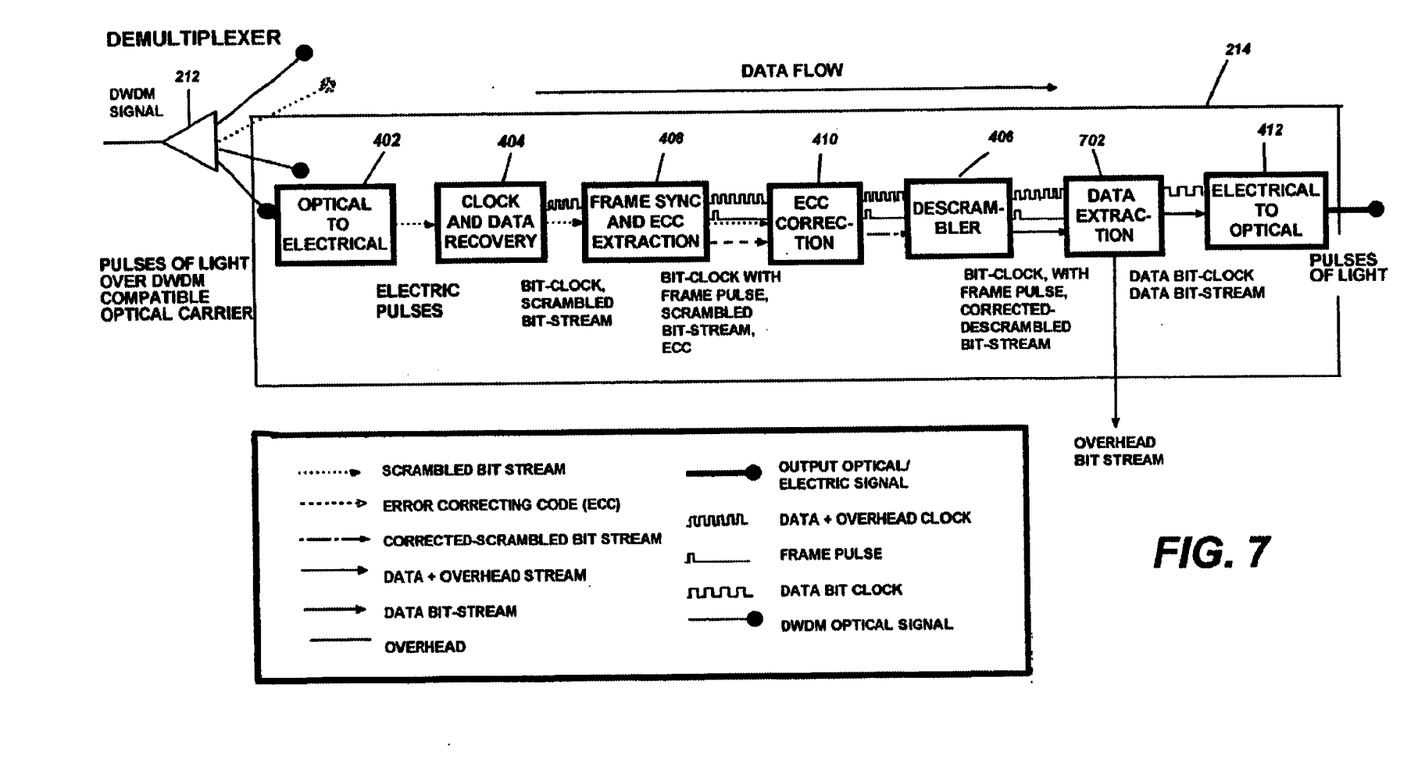
FIG. 7 is another embodiment of the present invention illustrating details of the optical output unit shown in FIG. 2.

FIG. 7 is another embodiment of the present invention illustrating details of the optical output unit 214 set forth in FIG. 2. The optically encoded bit-stream data transmitted via the optical fiber 210 and received by the demultiplexer 212 is accepted by the optical output unit 214. The encoded bit stream is converted into a binary data stream by unit 402 and further processed by unit 404. Frame synchronization is determined by unit 408 using frame synchronization fields or by using the error correcting code function and self-scrambled bit stream (original input data plus any optional overhead bytes) is extracted from the fixed or variable length frame.

Error correction is applied to the extracted bit stream by unit 410 and the resulting but still scrambled bit stream is passed through the self-synchronous descrambler 406. The data extraction unit 702, if required by the use of optional overhead fields, separates the original input binary stream from overhead fields. The extracted and recovered binary bit-stream data is then encoded by the electrical-to-optical unit 412 in a format that is compatible with the encoded input signal received by the optical-to-electrical unit 402.

The use of the self-synchronous scrambler of the present invention enables transport of arbitrary bit-patterns over DWDM networks. One of the embodiments described above offers a technique to control error multiplication as a result of the use of self-synchronous scrambler with a minimum of overhead. Overhead, as defined here, is the minimum number of additional bits that are added to transport and recover the bit-stream input to the DWDM network. The self-synchronous scrambler of the present invention equalizes the number of "1"s and "0"s in an input bit-patters over time periods of few bit-clock periods, making it suitable for transport over a DWDM channel, thereby providing for the recovery of the original bit-pattern from the scrambled pattern.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method for transforming and communicating an arbitrary bit-stream data into a bit-stream suitable for input to a dense wavelength division multiplexing (DWDM) network, the method comprising the steps of:

receiving an optically encoded digital data stream;

converting the encoded digital data stream to a binary data stream;

applying error correction to the binary data stream to generate an error correcting code over a fixed number of input bits to correct for error multiplication;

placing the error correcting code into the binary data stream to produce a bit-serial data stream;

applying a self-synchronous scrambler on the bit-serial data stream, the scrambler having an executable logic to equalize "1"s and "0"s, in the arbitrary bit-stream data, over a plurality of bit-clock periods to produce scrambled bit-stream data;

encoding the scrambled bit-stream data; and transmitting the encoded scrambled bit-stream data independent of its bit-stream characteristics and line coding.

2. The method as in claim 1, wherein the logic executed by the self-synchronous scrambler is of the form $$y_k = x_k \oplus (\Sigma p=1 \text{ to } m(y_{(k-p)} \oplus S_p))$$

where $\oplus$ denotes Exclusive OR function;

$x_k = k^{th}$ bit input to the scrambler;

$y_k = k^{th}$ bit output from the scrambler;

m=number of stages of the scrambler; and $S_p$=1 if Stage p is active and 0 if p is not active.

3. The method as in claim 1, wherein optical encoding is performed using NRZ or RZ encoding techniques.

4. The method as in claim 1, wherein said method eliminates bit-pattern artifacts in communication networks employing optical encoding schemes which fail to provide a DC balance.

5. The method as in claim 1, further comprising:

receiving and demultiplexing the encoded scrambled bit stream data;

converting the encoded scrambled bit stream data into a binary data stream;

descrambling the binary data stream using a self-synchronous descrambler having an executable logic, that is opposite to logic executed by the self-synchronous scrambler, to produce a bit-serial data stream;

identifying frame synchronization by applying the error correcting code on the bit-serial data stream;

separating data bits from error correcting code bits;

applying the error correcting code to correct single bit errors; and encoding descrambled binary bit stream in a format compatible with the encoded input data stream.

6. The method as in claim 5, further comprising:

providing a feedback loop to the self-synchronous descrambler to improve error correction performance by providing information of an error-bit;

retaining a scrambled copy of the error-bit; and substituting the error-bit by its ones complement.

7. The method as in claim 5, wherein the logic executed by the self-synchronous descrambler is of the form:

$$x_k = y_k \oplus (\Sigma p=1 \text{ to } m(y_{(k-p)} \oplus S_p))$$

where $\oplus$ denotes Exclusive OR function;

$y_k = k^{th}$ bit input to the descrambler;

$x_k = k^{th}$ bit output from the descrambler;

m = number of stages of the descrambler; and $S_p = 1$ if Stage p is active and 0 if p is not active.

8. In a digital data communications system having a transmitting station, a receiving station, and a communication medium communicatively coupling the transmitting and receiving stations, a method for transforming an arbitrary bit-stream data from the transmitting station to a bit-stream suitable for input to the data communications system, the method comprising:

receiving an optically encoded digital data stream by a DWDM input terminal unit;

generating a bit-serial data stream from optically encoded digital data received from the transmitting station;

applying a self-synchronous scrambler on the bit-serial data stream having an executable logic to equalize "1"s and "0"s in an input bit-pattern over time periods of several bit-clock periods and producing scrambled bit-stream data; and encoding and transmitting the scrambled bit-stream data independent of its bit-stream characteristics and line coding.

9. The method as in claim 8, wherein the step of generating the bit-serial data stream comprises:

converting the encoded digital data stream to a binary data stream;

applying error correction to the binary data stream to generate an error correcting code over a fixed number of input bits to correct for error multiplication; and placing the error correcting code into the binary data stream to produce a bit-serial data stream.

10. A method for transforming an arbitrary bit-stream into a bit-stream suitable for transmission on a digital data communications network and reconstituting the arbitrary bit-stream from transformed bit-stream, the method comprising:

converting an input data stream into a binary data stream;

generating an error correcting code over a fixed number of input bits to correct for error multiplication;

placing the error correcting code into the binary data stream to produce a bit-serial data stream;

applying a self-synchronous scrambler on the bit-serial data stream, the scrambler having an executable logic to equalize "1"s and "0"s in an input bit-pattern over a plurality of bit-clock periods to produce a scrambled bit-stream; and encoding and transmitting the scrambled bit-stream data independent of its bit-stream characteristics and line coding.

11. The method as in claim 10, wherein the logic executed by the scrambler is of the form:

$$y_k = x_k \oplus (\Sigma p=1 \text{ to } m(y_{(k-p)} \oplus S_p))$$

where $\oplus$ denotes Exclusive OR function;

$x_k = k^{th}$ bit input to the scrambler;

$y_k = k^{th}$ bit output from the scrambler;

m = number of stages of the scrambler; and $S_p = 1$ if Stage p is active and 0 if p is not active.

12. The method as in claim 10, further comprising:

receiving and converting the encoded bit-stream data into a binary data stream; and descrambling the binary data stream using a self-synchronous descrambler executing a logic that is opposite to logic of the scrambler.

13. The method as in claim 12, wherein the logic executed by the descrambler is of the form:

$$x_k = y_k \oplus (\Sigma p=1 \text{ to } m(y_{(k-p)} \oplus S_p))$$

where $\oplus$ denotes Exclusive OR function;

$y_k = k^{th}$ bit input to the descrambler;

$x_k = k^{th}$ bit output from the descrambler;

m = number of stages of the descrambler; and $S_p = 1$ if Stage p is active and 0 if p is not active.

14. A digital data communications system for transmitting an arbitrary input bit-stream data from a source station to a destination station via an optical communications medium communicatively coupling said source and destination stations, the digital data communications system comprising:

a DWDM input unit receiving the arbitrary data stream from the source station, said DWDM input unit including an optical-to-electrical conversion unit for converting the arbitrary input bit-stream data into binary data stream;

a self-synchronous scrambler executing a logic to equalize the number of "1"s and "0"s, in the binary data stream, over a plurality of bit-clock periods to produce a scrambled data stream; and an electrical-to-optical conversion unit for encoding and transmitting the scrambled data stream via the optical communication medium, wherein said scrambler enables said DWDM input unit to transport the arbitrary input bit-stream data independent of its bit-stream characteristics and line coding; and a DWDM output unit for receiving the scrambled data stream transmitted via said optical communications medium, said DWDM output unit including a self-synchronous descrambler executing a logic that is opposite to the logic executed by said self-synchronous scrambler.

15. The system as in claim 14, further comprises:

a multiplexer for placing more than one channel of data on the optical communications medium.

16. The system as in claim 14, wherein the logic executed by the scrambler is of the form:

$$y_k = x_k \oplus (\Sigma p=1 \text{ to } m(y_{(k-p)} \oplus S_p))$$

where $\oplus$ denotes Exclusive OR function;

$x_k = k^{th}$ bit input to the scrambler;

$y_k = k^{th}$ bit output from the scrambler;

m=number of stages of the scrambler; and $S_p$=1 if Stage p is active and 0 if p is not active.

17. The system as in claim 14, wherein the logic executed by the descrambler is of the form:

$$x_k = y_k \oplus (\Sigma p=1 \text{ to } m(y_{(k-p)} \oplus S_p)$$

where $\oplus$ denotes Exclusive OR function;

$y_k = k^{th}$ bit input to the descrambler;

$x_k = k^{th}$ bit output from the descrambler;

m=number of stages of the descrambler; and $S_p$=1 if Stage p is active and 0 if p is not active.

18. The system as in claim 14, wherein the logic executed by the scrambler is of the form:

$$y(k) = x(k) \oplus y(k-m)$$

where x(k) is the input to the scrambler;

y(k−m) is buffered output from m bits prior; and y(k) is the line output.

19. The system as in claim 14, wherein the logic executed by the descrambler is of the form $$x(k) = y(k) \oplus y(k-m); \text{ where}$$

x(k) is the input to the scrambler;

y(k−m) is buffered output from m bits prior;

y(k) is the line output.

20. A method for transforming an arbitrary bit-stream into a bit-stream suitable for input to a dense wavelength division multiplexing (DWDM) network, the method comprising:

receiving an optically encoded digital data stream by an optical input;

converting the encoded digital data stream to a binary data stream;

adding fixed-length overhead fields to the binary data stream to produce a bit-serial data stream;

applying a self-synchronous scrambler on the bit-serial data stream, the scrambler executing a logic to equalize "1"s and "0"s in an input bit-pattern over a plurality of bit-clock periods to produce scrambled bit-stream data;

generating and applying error correction code (ECC) to the scrambled bit-stream data to correct single bit-errors;

placing the scrambled bit-stream data and error correction code into a variable length frame having frame synchronization bytes to produce a scrambled bit-stream data with ECC; and encoding and transmitting the scrambled bit-stream data with ECC using optical encoding on a carrier suitable for optical multiplexing, wherein the scrambled bit-stream data with ECC is transmitted independent of its bit-stream characteristics and line coding.

21. The method as in claim 20, further comprising:

receiving and demultiplexing the encoded bit stream from the carrier;

identifying frame synchronization by applying the error correcting code on the bit-stream data;

applying the error correcting code to correct single bit errors;

extracting the scrambled bit stream from the variable length frame and applying error correction from the error correcting code employed;

descrambling the bit-stream data using a self-synchronous descrambler executing a logic that is opposite to logic executed by the scrambler;

separating data bits from error correcting code bits; and encoding descrambled binary bit stream in a format compatible with the encoded input data stream.

* * * * *